United States Patent [19]

Halleck

[11] Patent Number: 4,740,862

[45] Date of Patent: Apr. 26, 1988

[54] ION IMBALANCE MONITORING DEVICE

[75] Inventor: Michael E. Halleck, Longmont, Colo.

[73] Assignee: Westward Electronics, Inc., Aurora, Colo.

[21] Appl. No.: 942,180

[22] Filed: Dec. 16, 1986

[51] Int. Cl.⁴ .............................................. H05F 3/06
[52] U.S. Cl. ................................... 361/231; 361/235; 324/455; 324/464
[58] Field of Search .............. 361/229, 230, 231, 235; 55/104, 105; 324/452–470; 128/202.25

[56] References Cited

U.S. PATENT DOCUMENTS

| | | | |
|---|---|---|---|
| 2,264,495 | 12/1941 | Wilner | 361/235 X |
| 2,861,261 | 11/1958 | Coolidge, Jr. et al. | 55/104 |
| 4,318,152 | 3/1982 | Weber | 361/235 X |

Primary Examiner—L. T. Hix
Assistant Examiner—D. Rutledge
Attorney, Agent, or Firm—Robert E. Harris

[57] ABSTRACT

A relatively simple and compact device is disclosed for monitoring ion imbalance at a preselected, or work, area. A collector is utilized that is charged due to ions contiguous thereto, with the charge at the collector being processed, preferably utilizing a charging capacitor and operational amplifier, to provide an output signal indicative of ion imbalance at the preselected area, which output signal is then utilized to produce an indication of ion imbalance at the preselected area and/or to correct the ion output of an ion generator directing ions toward the preselected area. A pair of collectors can be utilized to separately sense positive and negative ions separately generated by an ion generator with the acquired charge on each collector being separately processed, and the indication of ion imbalance can be accomplished utilizing a meter and/or alarm.

19 Claims, 3 Drawing Sheets ductive plate or Piezo-electric elements that vibrate at precise frequencies are also used.

With respect to inexpensive high voltage meters that have been developed to measure discharge rates of air ionization equipment, such devices require an isolated plate isolated some distance from the ionizer to be charged at a high voltage (usually about 5000 volts), and will discharge due to the ionization equipment over a period of time to a stable low voltage. This system could be used to indirectly determine ion balance if the end discharge point of the material charged is known. Most non-conductive materials will not fully discharge to zero, however, due to the internal physics of the material itself and its environment.

As can be appreciated from the foregoing, a relatively simple and compact device for monitoring of ion balance can be utilized to good advantage to detect ion balance at a preselected area.

SUMMARY OF THE INVENTION

This invention provides a compact and relatively simple device for monitoring ion imbalance at a preselected area. The device includes collector means that is charged by ions contiguous thereto, processing means responsive to a charged collector means to provide an output signal having a polarity dependent upon the greater number of positive or negative ions providing the charge at the collector means, and utilization means for providing at least one of indication and correction of sensed ion imbalance.

It is therefore an object of this invention to provide a compact and relatively simple ion imbalance monitoring device.

It is another object of this invention to provide an improved monitoring device capable of indicating and/or correcting sensed ion imbalance at a preselected area.

It is still another object of this invention to provide an improved monitoring device having collector means, processing means, and utilization means for accurately monitoring a preselected area to sense ion imbalance thereat.

With these and other objects, which will become apparent to one skilled in the art as the description proceeds, this invention resides in the novel construction, combination, and arrangement of parts as substantially hereinafter described, and more particularly defined by the appended claims, it being understood that changes in the precise embodiment of the herein disclosed invention are meant to be as included as come within the scope of the claims.

BRIEF DESCRIPTION OF THE DRAWINGS

The accompanying drawings illustrate complete embodiments of the invention according to the best mode so far devised for the practical application of the principles thereof, and in which.

DESCRIPTION OF THE INVENTION

Figure 1:
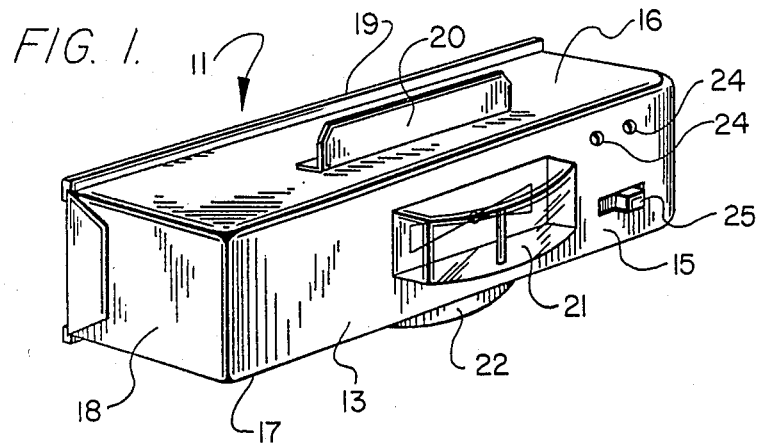
FIG. 1 is a perspective view of a monitoring device of this invention.

Referring now to the drawings, FIG. 1 illustrates a monitoring device 11, which device is preferably enclosed in housing, or casing, 13, which as indicated in FIG. 1, includes front wall 15, top wall 16, bottom wall 17, side walls 18, and back wall 19.

As also shown in FIG. 1, monitoring device 11 preferably includes a collector 20 mounted at top wall 16, a meter 21 viewable at front wall 15, and an alarm (horn) 22 mounted on bottom wall 17. Front wall 15 may also have small apertures 24 therein allowing tuning of electrical components within the housing, and off/on switch 25.

As mentioned above, monitoring device 11 is preferably quite compact, and, in a working embodiment, for example, monitoring device 11 was found to have dimensions of about four and one-half inches in length, about one and one-half inches in width and about one and one-quarter inches in height. In addition, collector 20 is preferably a small metallic plate having a thickness of about one-thirtysecond inches, an upstanding portion with a width of about one and three-fourths inches and a height of about three-eights inches, with the plate preferably having a base portion extending at right angles to the upstanding portion to allow mounting of the collector onto top wall 16 of housing 13.

Figure 2:
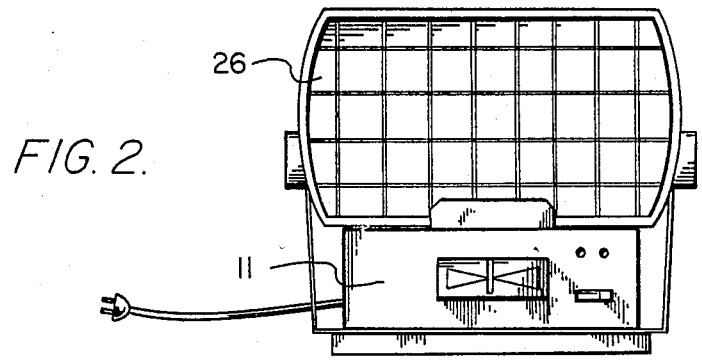
FIG. 2 is a front view illustrating the monitoring device shown in FIG. 1 positioned in front of an ion generator to sense ion imbalance thereat.

While monitoring device 11 may be positioned at a work area to monitor ions thereat, which ions may be directed to the work area from one or a plurality of ion generators, monitoring device 11 may be utilized in conjunction with an ion generator, as indicated in FIG. 2, to sense an imbalance in positive and negative ions generated by the associated ion generator. When so utilized, monitoring device 11 is preferably positioned in front of ion generator 26 to sample positive and negative ions generated by the ion generator and directed toward a preselected area (such as a work area) which is to receive a balanced number of positive and negative ions.

Figure 3:
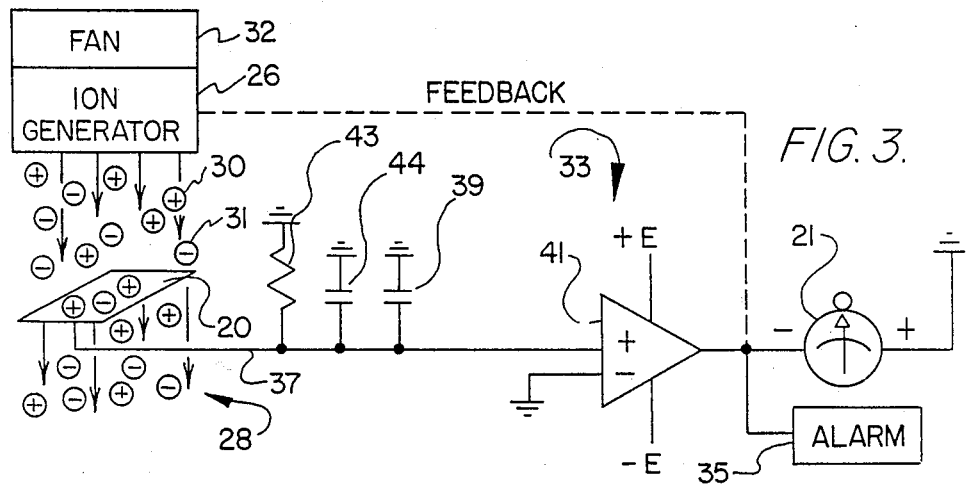
FIG. 3 is simplified electronic schematic illustrating an ion monitoring device having dual power supplies and single collector.

FIG. 3 illustrates a simplified electronic schematic of a monitoring device illustrating the principles of this invention. As shown, preselected, or work, area 28 receives both positive ions 30 and negative ions 31 generated by ion generator 26 (which ions may be expelled from the ion generator by means of a fan 32). As also indicated, collector, or catcher, plate 20 is positioned adjacent to ion generator 26, and in the path of ions expelled therefrom, so that the collector receives a relatively small sampling of the ions being directed toward preselected area 28.

Collector 20 is of sufficiently small size so as not to unduly interfere with ions directed toward preselected area 28, and, if desired, collector 20 can be of mesh construction. Collector 20 must, however, be positioned so as to receive a good numerical sampling of both positive and negative ions that reach preselected area 28 in order to sense any imbalance with respect thereto.

ION IMBALANCE MONITORING DEVICE

FIELD OF THE INVENTION

This invention relates to ion monitoring and, more particularly, relates to a device for monitoring for ion imbalance.

BACKGROUND OF THE INVENTION

Ion generators are now well known, and it is likewise well known that such ion generators are normally caused to produce both positive and negative ions.

Such ion generators are used to eliminate, or at least reduce, static electricity that might be present at a preselected, or work, area. At the present time, ion generators constitute the only known practical devices for reducing the static charges acquired by tribo electric, induced, or direct charge accumulation on nonconductive materials, such as various forms of plastic.

The general principle utilized is to generate equal and sufficient amounts of both positive and negative air ions, and then propel these ions into a preselected, or work, area to thereby discharge any charged particles in the area. An equal number of positive and negative ions in the air results in an overall net charge of zero. These charges of opposite polarity can co-exist with neutral air molecules since there are about $3 \times 10^{19}$ neutral air molecules for each ion, and the neutral air molecules therefore tend to isolate the charged air molecules. The oppositely charged ions neutralize each other when they meet, however, and a constant source of such ions must therefore be made available through ion generator devices. This recombination process is also responsible for neutralizing the static charges on isolated surfaces of non-conductive and conductive materials.

At the present time, there are two arrangements primarily used to produce charged positive and negative ions. One of these arrangements uses radioactive materials such as polonium to emit alpha particles that bombard neutral air molecules and produce equal numbers of positive and negative charged ions. Ion balance is not normally a problem with this type of system, since the oppositely charged molecules are created in pairs.

This system, while being relatively safe, has, however, several disadvantages including relatively low ion production, short half-life of the radioactive isotope, and stringent government control guidelines. Also, ion generation is reduced substantially over time due to the characteristics of the radioactive material, and alpha particles (which cannot penetrate the skin under normal conditions and therefore are used with this type of ionizer) are also impeded by water vapor from environments with high relative humidity conditions or which have an accumulation of smoke or dust particles surrounding the radioactive material.

The second type of electrical devices now used to generate appropriately charged ions utilize corona discharge of a high power supply fed into a sharp needle point which intensifies the field surrounding the needle. The dielectric strength of air is overcome, corona discharge occurs, and current flows either into the needle point from the air for positive ions or from the needle point into the air for negative ion generation.

Since it is generally easier to produce negative ions than positive ions, known electrical means of ion generation have, however, the disadvantage of producing an imbalance of ion charges. This can create a problem since the ion generation equipment used to discharge static charges toward a work area can also be a potentially dangerous source of problems should such equipment become unbalanced, or should a catastrophic failure occur in either the positive or negative ion generation system of the equipment.

Static charge control devices having needle electrodes for producing positive and negative ions are shown, for example, in U.S. Pat. Nos. 4,319,302 and 4,333,123 (Moulden) and in U.S. Pat. No. 3,624,448 (Saurenman). While not always necessary, these patents also illustrate the use of a forced air unit, such as a fan, to propel the ions away from the area where such ions have been generated (U.S. Pat. No. 4,038,383 to Breton, for example, shows an ion generator system wherein forced air is not utilized to propel the ions). Balancing of ions is suggested in U.S. Pat. No. 4,092,543 to Levy. In addition, applicant's U.S. patent application Ser. No. 884,009 filed July 10, 1986 and entitled "Static Charge Control Device Having Laminer Flow" and U.S. patent application Ser. No. 884,011, filed July 10, 1986 and entitled "Static Charge Control Device With Electrostatic Focusing Arrangement", teach balanced production of positive and negative ions and directing of such ions toward a preselected area for elimination of static charges thereat.

While systems and devices have heretofore been suggested to measure ion balance, devices now utilized have been relatively burdensome, complex, and/or expensive. Among such devices are ion grid meters and electrostatic field meters with mechanically movable transducers such as vibrating plates, motor driven plates, or Piezo electro-elements. In addition, inexpensive passively coupled meters have also been heretofore utilized for gross measurements, but such meters have not proved to be sufficiently sensitive and cannot continuously monitor ion balance to meet industry requirements for continuous finer measurements as the size and complexity of integrated circuits continues to decrease and increase, respectively.

With respect to ion grid meters, these devices are used to measure the number of charged molecules per unit area and rely on the principle that ionized air molecules, either positive or negative, reduce the impedance of the air pathway, and thereby will provide a lower impedance to the flow of current through the pathway. These devices require the use of very stable high voltage power supplies and a very low scale current meter, usually a nanoamp meter. By reversing the polarity of the high voltage power supply, both the number of positively and negatively charged air molecules can be measured. Any imbalance in the positive to negative charges will be directly related to the current flow through the system and therefore imbalance can be measured.

With respect to static field meters used to measure ion imbalance, since an electrostatic field, by definition, does not move, such a device must have an element which does move within the field in order to measure the effect. Therefore, the transducer pickup device usually incorporates some mechanical means to move a plate or conductor in the vicinity of the electrostatic field. These devices are usually small plates vibrating at precise frequencies and distances, which cut through the static field and are converted into field intensity measurements on some form of visual indicator. Small motors that move one plate in relation to another con- The monitoring device, as indicated in FIG. 3, includes collector 20, processing circuitry 33, and utilization means (illustrated as meter 21 in FIG. 3).

As also indicated in FIG. 3, the utilization means may also be an alarm 35 (which can be achieved audibly, visually or both by means of a horn and/or light) and alarm 35 can be utilized in conjunction with, or in lieu of, meter 21. In addition, the output from the processing circuitry 33 may be utilized to provide a feedback signal to be coupled to the ion generator to automatically correct for any imbalance in ions directed to the predetermined area by the ion generator (this can be conventionally accomplished, for example, by directing the feedback signal to the high voltage power supplies in the ion generator to regulate the ion output within practical limits to thus achieve a balanced output of positive and negative ions). The feedback signal can also be utilized to shut down or turn off the ion generator in the event of catastrophic failure of the equipment.

As indicated in FIG. 3, collector plate 20 is electrically connected with processing circuitry 33 by means of lead 37. As shown, processing circuitry 33 includes charging capacitor 39 connected with the positive input of operational amplifier, or gate, 41. The input impedance of the operational amplifier is indicated by resistor 43, and the capacitance of collector plate 20 is illustrated by capacitor 44. Operational amplifier 41 is shown connected to dual power supplies ($+E$ and $-E$), its negative input is connected with ground as a reference, and its output is connected with one side of meter 21 to provide an output signal indicative of sensed ion imbalance. The sensitivity of the overall system is directly related to the gain of the operational amplifier and the area of the collector utilized.

In operation of the monitoring device, as shown in FIG. 3, ions reaching collector 20 recombine thereat and result in a net zero charge and zero voltage realized at the collector plate so long as an equal number of positive and negative ions are at the collector plate, and therefore an ion balance is sensed. When this occurs, capacitor 39 will not be caused to charge to any voltage.

If, however, a greater number of positive ions, for example, are at the collector, then capacitor 39 will begin to charge in a positive direction, and operational amplifier 41 will begin to conduct current and drive meter 21 to indicate the presence of a greater number of positive ions than negative ions (the meter is driven to the right as illustrated in FIG. 3).

In like manner, if there is an excess of negative ions in relationship to positive ions at the collector, capacitor 39 will charge to a negative voltage and operational amplifier 39 will provide an output that deflects meter 21 to indicate the presence of a greater number of negative ions than positive ions (the meter is driven to the left as illustrated in FIG. 3).

Figure 4:
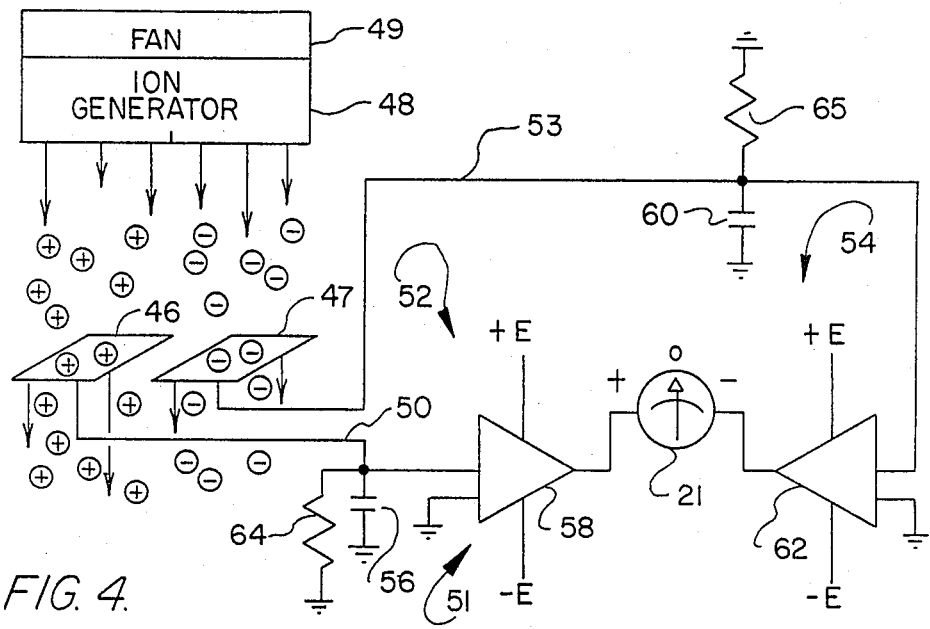
FIG. 4 is a simplified electronic schematic similar to that of FIG. 3 but having dual collectors.

FIG. 4 illustrates a simplified diagram substantially similar to that of FIG. 3 but shows the use of a dual collector arrangement. As shown, collector plates 46 and 47 are positioned so that collector 46 primarily receives positive ions from ion generator 48, (which separately produces positive and negative ions which are directed toward the preselected area) and collector 47 primarily receives negative ions from ion generator 48 (as illustrated, the ions may be directed away from the ion generator by means of fan 49).

In the embodiment of the monitoring device shown in FIG. 4, collector 46 is connected by lead 50 to one side 51 of dual processing circuitry 52, while collector 47 is connected by lead 53 to other side 54 of dual processing circuitry 52. Side 51 of dual processing circuitry 52 includes charging capacitor 56 connected with one input (such as the + input) of operational amplifier 58, while side 54 of dual processing circuitry 52 includes charging capacitor 60 connected with one input (such as the + input) of operational amplifier 62. The impedance of operational amplifiers 58 and 62 is indicated by resistors 64 and 65, respectively. The other input of each operational amplifier is grounded, and the outputs of the operational amplifiers are connected to the opposite sides of meter 21 (as indicated in FIG. 4).

In the embodiment of the invention shown in FIG. 4, operational amplifiers 58 and 62 are connected in a bridge format with the collectors, and since collectors 46 and 47 charge to a value which is directly related to the number of ions at each collector, any imbalance (i.e. sensing of a greater number of ions of one polarity at one collector with respect to the number of ions of the opposite polarity sensed at the other collector) will be reflected (through the associated capacitors and operational amplifiers) at the side of the meter connected with the collector sensing the greater number of ions so that the meter will be deflected to indicate that an imbalance exists with the meter being deflected to indicate the polarity of sensed greater number of ions (the meter could, if desired, however, be configured to indicate the ions in shorter supply).

Figure 5:
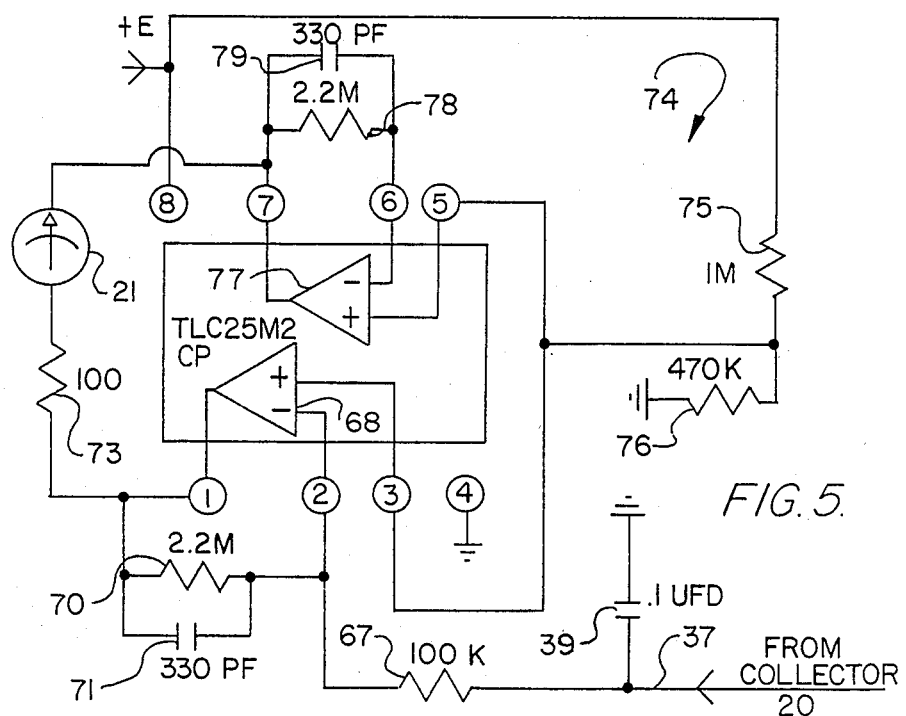
FIG. 5 is a simplified electronic schematic similar to that of FIG. 3 but having a single power supply.

FIG. 5 illustrates a simplified electronic schematic similar to that of FIG. 3 but shows the use of a single power supply. As shown, the input on lead 37 (from collector 20) is coupled through resistor 67 to the negative input of operational amplifier 68 (part of a TLC 25M2 chip). Charging capacitor 39 is connected to the junction of lead 37 and resistor 67. The output of operational amplifier 68 is connected, by parallel connected resistor 70 and capacitor 71, to the negative input of the operational amplifier, and the output of the operational amplifier is connected with one side of meter 21 through small resistor 73.

The single power supply ($+E$) used is connected with voltage divider 74 (consisting of serially connected resistors 75 and 76) and the junction of resistors 75 and 76 is connected to the positive input of operational amplifiers 68 and 77. The negative input of operational amplifier 77 is connected with the output through parallel connected resistor 78 and capacitor 79, and the output is connected with the side of meter 21 opposite to that of the connection of the output of operational amplifier 68 to the meter.

The monitoring device, as shown in FIG. 5, operates in the same manner as does the embodiment of the monitoring device of FIG. 3, except that only a single power supply is needed (as opposed to the dual power supplies utilized in the embodiment shown in FIG. 3).

Figure 6:
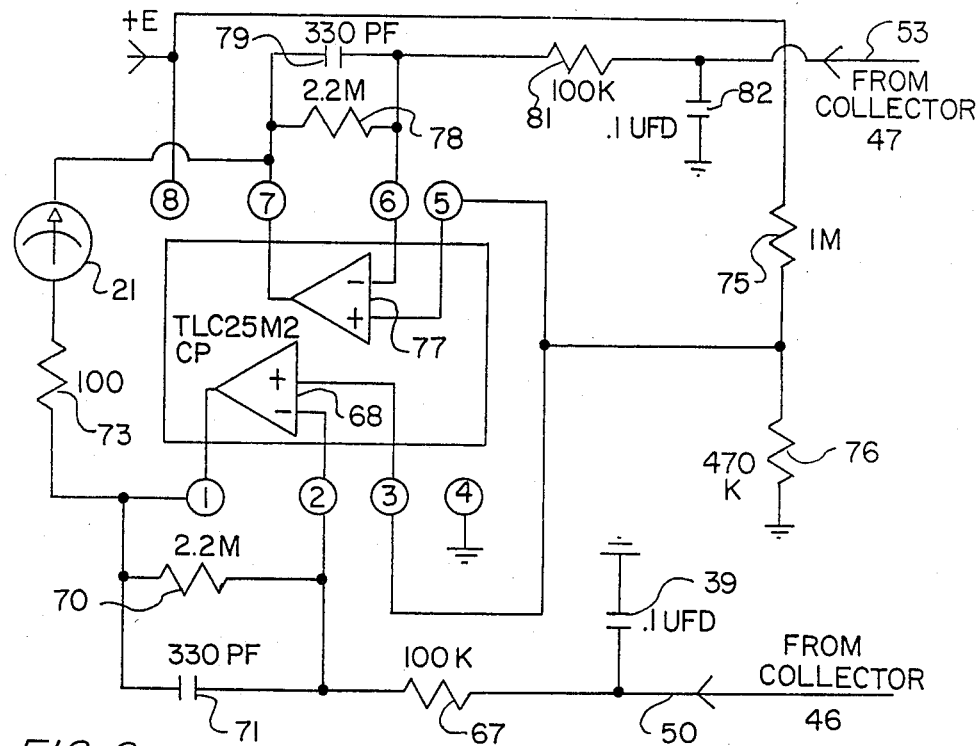
FIG. 6 is a simplified electronic schematic similar to that of FIG. 5 but using dual collectors.

FIG. 6 is similar to FIG. 4 but illustrates use of a single power supply and a dual collector arrangement. As illustrated, the arrangement is the same as set forth in the embodiment of the monitoring device shown in FIG. 5, except that lead 50 (connected with collector 46) is connected with the negative input of operational amplifier 68 (through resistor 67) and lead 53 (connected with collector 47) is connected to the negative input of operational amplifier 77 through resistor 81 (having capacitor 82 to ground connected therewith). The embodiment of the monitoring device shown in FIG. 6 operates in the same manner as described hereinabove with respect to the other embodiments set forth, but utilizes a single power supply (as opposed to the dual power supplies utilized in the embodiment of the monitoring device as shown in FIGS. 3 and 4).

Figure 7:
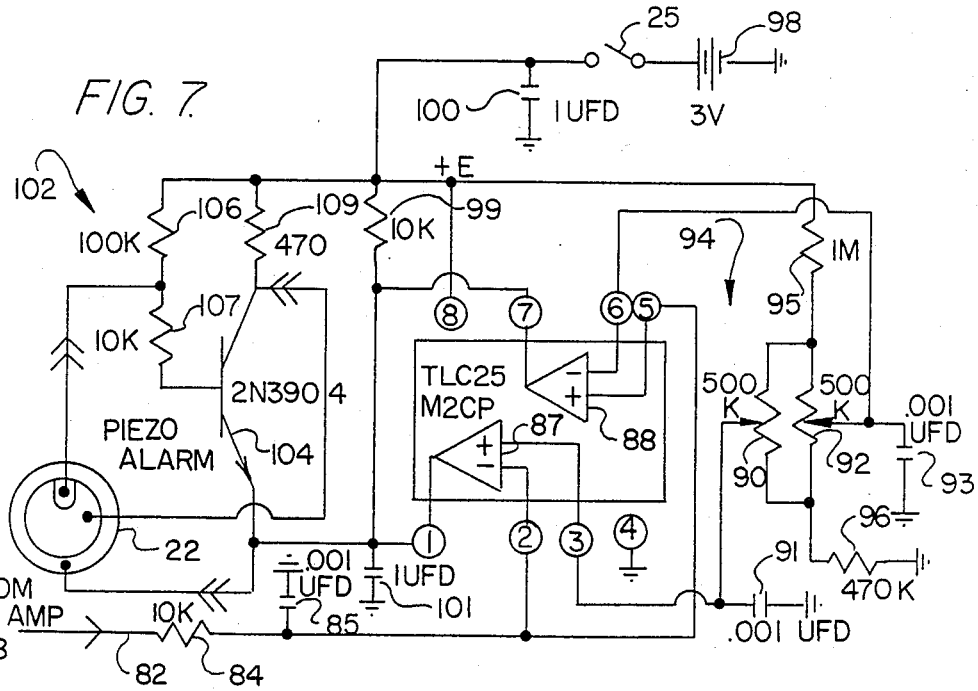
FIG. 7 is an electronic schematic illustrating use of alarm circuitry in connection with a single power supply and single plate with the circuitry of FIG. 7 being preferably utilized as a part of the monitoring device shown in FIGS. 1 and 2.

FIG. 7 illustrates inclusion of an alarm (horn) 22 as a utilization device in conjunction with meter 21. In FIG. 7, a single collector, and single power supply are utilized (as is illustrated in FIGS. 1, 2 and 5) but it is meant to be realized that dual collectors and dual power supplies could also be utilized. As shown, lead 82 (from the output of operational amplifier 68 as shown in FIG. 5) is coupled through resistance 84 (having capacitor 85 to ground connected in parallel therewith) to the negative inputs of operational amplifiers 87 and 88. The positive inputs of operational amplifiers 87 and 88 are connected to the variable tap of potentiometer 90 (which has a capacitor 91 to ground connected therewith). Potentiometer 90 is connected in parallel with potentiometer 92, the variable tap (which has capacitor 93 to ground connected therewith) of which is connected with the negative input of operational amplifier 88. Potentiometers 90 and 92 are connected as part of a voltage divider 94 that includes series connected resistors 95 and 96.

As also indicated in FIG. 7, the +E power supply (3 volts) is preferably supplied from battery 98 through off/on switch 25. Resistor 99 connects the +E power supply with the outputs of operational amplifiers 87 and 88. In addition, the +E power supply has coupling capacitors 100 and 101 to ground connected therewith at the opposite sides of resistor 99.

Internal monitoring of the battery and associated circuitry (including the audible sound system and metering system) is accomplished by use of circuitry 102. As shown, circuitry 102 includes transistor 104, the emitter of which is connected with one lead of Piezo alarm 22 and the output of operational amplifier 68, the base of which is connected with series connector resistors 106 and 107 (the junction of which is connected with a second lead of alarm 22), and the collector of which is connected through resistor 109 to the +E power supply (and also with a third lead of alarm 22).

The operation of the monitoring device, as shown in FIG. 7, is the same as described hereinabove with respect to the other embodiments illustrated except that it includes an adjustable level for the audible alarm with ion imbalance thresholds being independently setable by positioning of potentiometers 90 and 92 (as by adjusting the positioning of the center taps of the potentiometers through apertures 24 at front wall 15 of the casing). As shown, the circuitry of the monitoring device is also designed so that power supply variations will have no effect on the balance of the entire system.

As can be appreciated from the foregoing, this invention provides a monitoring device that is compact and relatively simple, yet is dependable in producing accurate indications of ion imbalance. When used in conjunction with an ion generator, for example, the device of this invention is capable of continuous monitoring of ion charge balance in order to give a visual indicator of imbalance, the amount of such imbalance which could be due, for example, to corrosion of needle points or accumulation of dirt or particles on the needle points, and/or an audible (or visual) indicator of an alarm condition (automatic correction of sensed ion imbalance can also be effected).

What is claimed is:

1. A monitoring device for sensing imbalance of positive and negative ions at a preselected area, said monitoring device comprising:
    collector means capable of being electrically charged by ions contiguous thereto, said collector means being positioned such that the net electrical charge on said collector means, caused by ions contiguous thereto, accurately reflects differences in the number of positive and negative ions at said preselected area;
    electronic charge processing means electrically connected with said collector means to receive said net electrical charge thereon due to said positive and negative ions received at said collector means, and responsive thereto, providing output signals indicative thereof; and
    utilization means connected with said charge processing means to receive said output signals therefrom and utilize the same to provide at least one of indication and correction of ion imbalance at said preselected area.

2. The monitoring device of claim 1 wherein said collector means includes at least one metallic plate positioned to be electrically charged by positive and negative ions contiguous thereto.

3. The monitoring device of claim 2 wherein said collector means includes first and second metallic plates each of which is positioned to be primarily electrically charged by a different one of said positive and negative ions, and wherein said charge processing means is connected with said first and second metallic plates to receive charges on each and provide output signals indicative thereof.

4. The monitoring device of claim 3 wherein said charge processing means includes first and second charge processors each of which is connected with a different one of said first and second metallic plates.

5. The monitoring device of claim 4 wherein each of said first and second charge processors include charging means and amplifying means operable in response to a charge on said charging means to provide said output signals.

6. The monitoring device of claim 1 wherein said charge processing means includes charging means for receiving said electrical charge on said collector means, and gate means operable in response to at least a predetermined charge on said charging means to provide said output signals.

7. The monitoring device of claim 6 wherein said charging means includes a capacitor, and wherein said gate means includes an operational amplifier.

8. The monitoring device of claim 1 wherein said utilization means includes at least one of metering means and alarm means for indicating said ion imbalance.

9. The monitoring device of claim 1 wherein ions are supplied to said preselected area by ion generating means, and wherein said utilization means includes means for coupling said output signals to said ion generation means to automatically correct ion imbalance at said preselected area.

10. The monitoring device of claim 1 wherein said charge processing means is powered by one of dual power supplied and a single power supply.

11. A monitoring device for sensing ion imbalance at a preselected area spaced from ion generating means directing positive and negative ions toward said preselected area, said monitoring device comprising:

collector means;

positioning means for positioning said collector means in the path of ions directed toward said preselected area by said ion generating means so that said collector means is charged due to said ions;

chargeable means connected with said collector means, said chargeable means being charged due to a sensed imbalance between positive and negative charges on said collector means;

amplifying means connected with said charging means and providing an output signal when said charging means has at least a predetermined charge thereon; and indicating means connected with said amplifying means to receive said output signals therefrom, and responsive thereto, providing an indication of ion imbalance sensed at said collector means.

12. The monitoring device of claim 11 wherein said monitoring device continuously monitors said ion generating means whenever said ion generating means is directing ions toward said preselected area.

13. The monitoring device of claim 11 wherein said ion generating means includes means for separately providing positive and negative ions which are separately directed toward said preselected area, wherein said collector means includes first and second collectors each of which is positioned by said positioning means to primarily receive a different one of said positive and negative ions, wherein said chargeable means includes first and second capacitors each of which is connected with a different one of said first and second collectors, wherein said amplifying means includes first and second operational amplifiers each of which is connected with a different one of said first and second capacitors, and wherein said indicating means is connected with said first and second operational amplifiers and is responsive to both in providing said ion imbalance indication.

14. The monitoring device of claim 11 wherein said device is powered by a single power supply, and wherein said amplifying means includes a pair of operational amplifiers the outputs of which are connected with said indicating means, and wherein said monitoring device includes a voltage divider connecting said single power supply with one input of said pair of operational amplifiers, and with the other input of at least one of said pair of operational amplifiers being connected with said chargeable means.

15. The monitoring device of claim 11 wherein said indicating means is at least one of a meter and an alarm.

16. A monitoring device for sensing ion imbalance at a preselected area receiving positive and negative ions from ion generating means, said monitoring device comprising:

collector means positioned in the path of ions from said ion generator means with said collector means being charged by positive and negative ions contiguous to said collector means;

capacitor means connected with said collector means to receive and store net charges sensed at said collector means so that said capacitor means is charged to a voltage and polarity dependent upon the number and polarity of the greater number of ions charging said collector means;

reference voltage means;

operational amplifier means connected with said reference means and said capacitor means, said operational amplifier means providing an output signal when said voltage stored at said capacitor means is greater than said reference voltage means;

meter means connected with said operational amplifier means for indicating ion imbalance and the polarity thereof;

threshold establishing means; and alarm means connected with said operational amplifier means and said threshold means for establishing an alarm indication when the value of said threshold means is exceeded.

17. The monitoring device of claim 16 wherein said operational amplifying means includes first and second operational amplifiers one input of each of which is connected with said reference means, the other input of at least one of which is connected with said capacitor means, and the outputs of each of which are connected with the opposite sides of said meter means.

18. The monitoring device of claim 17 wherein said alarm means includes third and fourth operational amplifiers and a Piezo alarm connected with said third operational amplifier, and wherein said threshold establishing means with first and second potentiometers each of which is connected with a different one of said third and fourth operational amplifiers.

19. The monitoring device of claim 16 wherein said device includes power means for powering said device and means connected with said power means, meter means and alarm means to assure proper operating conditions for each.

* * * * *